(12) United States Patent
Sirigineedi et al.

(10) Patent No.: US 12,362,122 B2
(45) Date of Patent: Jul. 15, 2025

(54) MONITORING SYSTEMS AND METHODS FOR ESTIMATING THERMAL-MECHANICAL FATIGUE IN AN ELECTRICAL FUSE

(71) Applicant: EATON INTELLIGENT POWER LIMITED, Dublin (IE)

(72) Inventors: Gopinadh Sirigineedi, Pune (IN); Pandarinath R, Pune (IN); Ravishankar S, Pune (IN); Robert Stephen Douglass, Wildwood, MO (US); Harold Handcock, Kinoulton (GB); Uppu Harish, Pune (IN)

(73) Assignee: Eaton Intelligent Power Limited, Dublin (IE)

(*) Notice: Subject to any disclaimer, the term of this patent is extended or adjusted under 35 U.S.C. 154(b) by 78 days.

(21) Appl. No.: 17/667,272

(22) Filed: Feb. 8, 2022

(65) Prior Publication Data
US 2022/0157547 A1    May 19, 2022

Related U.S. Application Data

(63) Continuation of application No. 15/994,491, filed on May 31, 2018, now Pat. No. 11,289,298.

(51) Int. Cl.
*H01H 85/30*    (2006.01)
*G01R 31/74*    (2020.01)
*H01H 85/08*    (2006.01)

(52) U.S. Cl.
CPC .............. *H01H 85/30* (2013.01); *G01R 31/74* (2020.01); *H01H 85/08* (2013.01)

(58) Field of Classification Search
CPC ......... H01H 85/30; H01H 85/08; G01R 31/74
See application file for complete search history.

(56) References Cited

U.S. PATENT DOCUMENTS

| | | | |
|---|---|---|---|
| 5,148,140 A * | 9/1992 | Goldstein | H01H 85/18 337/273 |
| 11,289,298 B2 * | 3/2022 | Sirigineedi | H01H 85/30 |

FOREIGN PATENT DOCUMENTS

| | | |
|---|---|---|
| CN | 101915887 A | 12/2010 |
| CN | 101776720 B | 9/2011 |
| JP | 2011061886 A * | 3/2011 |

(Continued)

OTHER PUBLICATIONS

Jie Shi, Multi-Factors Ageing Condition Inspection and Lifetime Prediction for Low Voltage Fuse, 2012 International Conference on Computer Science and Information Processing (CSIP), pp. (Year: 2012).*

(Continued)

*Primary Examiner* — Michael J Dalbo
*Assistant Examiner* — Kaleria Knox
(74) *Attorney, Agent, or Firm* — Baker Botts L.L.P.

(57) ABSTRACT

Systems and methods for estimating a thermal-mechanical fatigue in an electrical conductor in a thermal-mechanical fatigue assessment system include an electrical conductor having a cold resistance and a non-linear resistance when connected to an electrical power system, and a controller receiving temperatures of the conductor as inputs, wherein the controller is operable to estimate a service life of the conductor based on at least the input temperatures of the conductor and the cold resistance of the conductor.

18 Claims, 9 Drawing Sheets

(56) References Cited

FOREIGN PATENT DOCUMENTS

WO    WO-2016123463 A2 *  8/2016  ............. G06F 1/266

OTHER PUBLICATIONS

Shi Jie, "Multi-factors Ageing condition Inspection and Lifetime Prediction for Low Voltage Fuse", pp. 1227-1231 (Year: 2012).*
EP Communication received from EPO for Patent Application No. 19177451.2-1001, mailed on Oct. 6, 2022, 7 pages.

* cited by examiner

MONITORING SYSTEMS AND METHODS FOR ESTIMATING THERMAL-MECHANICAL FATIGUE IN AN ELECTRICAL FUSE

BACKGROUND OF THE INVENTION

The field of the invention relates generally to electrical power distribution systems, and more specifically to systems and methods for estimating a service life of a fuse element having a non-linear resistance in an electrical circuit based on temperatures of the fuse element while the circuit is energized.

Fuses are widely used as overcurrent protection devices to prevent costly damage to electrical circuits. Fuse terminals typically form an electrical connection between an electrical power source or power supply and an electrical component or a combination of components arranged in an electrical circuit. One or more fusible links or elements, or a fuse element assembly, is connected between the fuse terminals, so that when electrical current flow through the fuse and/or temperature of the fuse exceeds a predetermined limit, the fusible elements melt and opens one or more circuits through the fuse to prevent electrical component damage.

In many electrical power systems for electric-powered vehicles and other electrical systems fuse failure as a result of a thermal-mechanical fatigue process can either be a nuisance or an emergency. In view of the expanding use of electric-powered vehicles and other electronic systems, affordable fuse use monitoring systems and methods that can evaluate a thermal condition, and therefore the fatigue and service life, of an electrical fuse and predict or estimate a remaining service life of the fuse toward the goal of replacing a thermal cycle fatigued fuse before it fails from the fatigue process are desired to meet the needs of the marketplace.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIG. 1 illustrates an exemplary current profile that an electrical power fuse may be subjected to.

FIG. 4 illustrates an exemplary performance of the current deduction technique illustrated in FIG. 3 and an exemplary performance of an exemplary temperature calculation technique according to an embodiment of the present invention, wherein FIG. 4 illustrates a plot of deduced current versus time and a plot of calculated temperature versus time in the exemplary fuse element.

FIG. 8 illustrates an exemplary performance of the exemplary fuse service life estimation technique shown in FIG. 7, wherein FIG. 8 illustrates plots of an estimated B5 service life, and estimated B50 service life, and an estimated B95 service life for a second sample of fuses versus actual service life for the second sample of fuses.

DETAILED DESCRIPTION OF THE INVENTION

Figure 1:
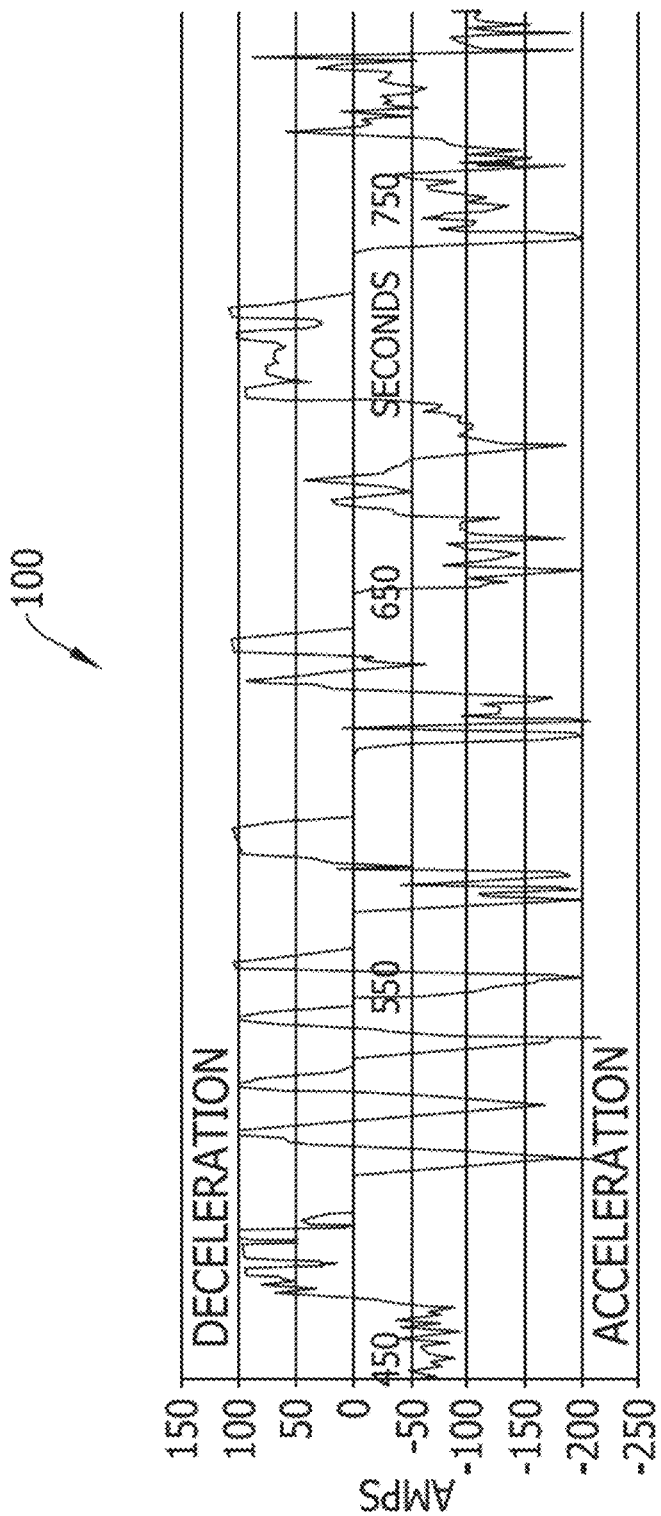

Recent advancements in electric vehicle technologies, among other things, present unique challenges to fuse manufacturers. Electric vehicle manufacturers are seeking fusible circuit protection for electrical power distribution systems operating at voltages much higher than conventional electrical power distribution systems for vehicles, while simultaneously seeking less costly fuses with effective temperature monitoring functionality to facilitate detection of impending failure conditions, for example, to meet electric vehicle specifications and demands.

Electrical power systems for conventional, internal combustion engine-powered vehicles operate at relatively low voltages, typically at or below about 48 VDC. Electrical power systems for electric-powered vehicles, referred to herein as electric vehicles (EVs), however, operate at much higher voltages. The relatively high voltage systems (e.g., 200 VDC and above) of EVs generally enables the batteries to store more energy from a power source and provide more energy to an electric motor of the vehicle with lower losses (e.g., heat loss) than conventional batteries storing energy at 12 volts or 24 volts used with internal combustion engines, and more recent 48 volt power systems.

EV original equipment manufacturers (OEMs) employ circuit protection fuses to protect electrical loads in all-battery electric vehicles (BEVs), hybrid electric vehicles (HEVs) and plug-in hybrid electric vehicles (PHEVs). Across each EV type, EV manufacturers seek to maximize the mileage range of the EV per battery charge while reducing cost of ownership. Accomplishing these objectives turns on the energy storage and power delivery of the EV system, as well as the cost, size, volume, and mass of the vehicle components that are carried by the power system. Smaller, more affordable, and/or lighter vehicles will more effectively meet these demands than larger, more expensive, and heavier vehicles, and as such all EV components are now being scrutinized for potential size, weight, and cost savings.

Generally speaking, more complex components with temperature monitoring systems tend to have higher associated material costs, higher finished component costs, and tend to increase the overall size of the EV of occupy an undue amount of space in a shrinking vehicle volume, and tend to introduce greater mass that directly reduces the vehicle mileage per single battery charge. Known high voltage circuit protection fuse incorporating some types of temperature and service life monitoring are, however, relatively complex, expensive, and relatively large. Historically, and for good reason, circuit protection fuses have tended to increase in complexity, cost, and size to meet the demands of high voltage power systems as opposed to lower voltage systems. As such, existing fuses needed to protect high voltage EV power systems are much larger than the existing fuses needed to protect the lower voltage power systems of conventional, internal combustion engine-powered vehicles. Less complex, less expensive, and smaller high voltage power fuses incorporating temperature and service life monitoring features are desired to meet the needs of EV manufacturers, without sacrificing circuit protection performance and reliability.

Electrical power systems for state of the art EVs may operate at voltages as high as 450 VDC. The increased power system voltage desirably delivers more power to the EV per battery charge. Operating conditions of electrical fuses in such high voltage power systems are much more severe, however, than lower voltage systems. Specifically, specifications relating to electrical arcing conditions as the fuse opens can be particularly difficult to meet for higher voltage power systems, especially when coupled with the industry preference for reduction in the size of electrical fuses. Current cycling loads, and resulting temperature cycling, imposed on power fuses by state of the art EVs also tend to impose mechanical strain and wear that can lead to shortening of the fuse's expected service life and premature failure of a conventional fuse element due to fuse element fatigue. While known power systems incorporating temperature and service life monitoring features of various component are presently available for use by EV OEMs in high voltage circuitry of state of the art EV applications, monitoring of fuse fatigue issues presents particular challenges that have not yet been completely resolved in the marketplace. Lower cost yet reliable fuse monitoring systems are therefore desired.

Inventive systems and methods are disclosed below wherein monitoring the fatigue of the fuse is achieved at least in part by monitoring a fatigue parameter such as fuse element temperature or mechanical strain, and comparing the monitored parameter to known fatigue parameters for a similar fuse element to assess a state of fatigue and remaining service life of the fuse. Fatigue monitoring may also be achieved by monitoring fuse temperature, calculating a strain associated with peak fuse element temperatures in a cyclic current load, computing a fatigue damage component for each peak temperature, and accumulating the fatigue damage components over time to assess a state of fatigue and an associated remaining service life of the fuse.

FIG. 1 illustrates an exemplary current drive profile 100 in an EV power system application that can render a fuse, and specifically the fuse element or elements therein susceptible to load current cycling fatigue, at least partially due to temperature cycling. The current is shown along a vertical axis in FIG. 1 with time shown along the horizontal axis. In typical EV power system applications, power fuses are utilized as circuit protection devices to prevent damage to electrical loads from electrical fault conditions. Considering the example of FIG. 1, EV power systems are susceptible to large variances in current loads, and therefore large variances in temperature over relatively short periods of time. The variance in current produces current pulses of various magnitude in sequences produced by seemingly random driving habits based on the actions of the driver of the EV vehicle, traffic conditions and/or road conditions. This creates a practically infinite variety of current and temperature loading cycles on the EV drive motor, the primary drive battery, and any protective power fuse included in the system.

Such random current loading conditions, exemplified in the current pulse profile of FIG. 1, are cyclic in nature for both the acceleration of the EV (corresponding to battery drain) and the deceleration of the EV (corresponding to regenerative battery charging). This current cyclic loading imposes cyclic thermal stress on the fuse element, and more specifically in the so-called weak spots of the fuse element assembly in the power fuse, by way of a joule effect heating process. This cyclic thermal loading of the fuse element imposes mechanical expansion and contraction cycles on the fuse element weak-spots in particular. This repeated mechanical cyclic loading of the fuse element weak spots imposes an accumulating strain that damages the weak spots to the point of breakage in time. For the purposes of the present description, this thermal-mechanical process and phenomena is referred to herein as fuse fatigue. Fuse fatigue is attributable mainly to creep strain as the fuse endures the drive profile, and is one of the primary limiting factors of the service life of a fuse. Heat generated in the fuse element weak spots is the primary mechanism leading to the onset of fuse fatigue, fuse failure.

For the purposes of this description, the term "service life" is made in reference to the useful life of a conductor, or fuse, when in use as part of an electrical power system—i.e., from initial use to a point of failure of the conductive abilities of the conductor. As will be discussed further below, commonly tracked service life metrics include a B5 service life, a B50 service life, and a B95 service life, among others. These divisions within the broader category of general service life serve as indicators of expected operational usability based on empirical sampling of like or similar components. For example, for components having a normal failure distribution, the B5 service life is the point at which five percent of all of like components in service will have failed, the B50 service life is a duration of use at which point fifty percent of the like components in service will have failed, and the B95 service life a duration of use at which point ninety-five percent of the like components in service will have failed. It is contemplated that the service life being estimated using the techniques and algorithms described herein can be at least one of a continuously updated service life, a service life consumed at the point of observation, and a service life remaining estimation.

Described below are exemplary embodiments of systems and methods that facilitate a computationally-efficient and cost effective estimation of a service life of a conductor having a non-linear resistance, such as an electrical fuse element. The systems and methods facilitate estimating the service life of the fuse element towards the goal of replacing a thermal-mechanical cycle fatigued fuse before it fail while in use. This is achieved, as explained in detail below, by deducing (i.e. calculating, estimating, and/or receiving as inputs) a cold resistance of the fuse, temperatures of the fuse element for a period of time, determining a temperature differential for the temperatures during the period of time, determining a mean temperature for the temperatures during the period of time, and applying a regression model to the determined temperature differential, the determined mean temperature, and the cold resistance of the fuse to estimate the service life of the fuse. The system may accordingly provide alerts and notifications concerning a monitored temperature cycle count, a monitored mean temperature, a monitored temperature differential, record data and information concerning the same, communicate the data and information concerning the same, communicate the data and information to remote devices, and even recognize overtemperature and/or large temperature differentials that may cause the fuse to open/fail prior to its standard expected service life. Method aspects will be in part apparent and in part explicitly discussed in the following description.

While the present invention is described in the context of EV applications generating a current profile such as that shown in FIG. 1, and while the invention is also described in the context of a particular type and rating of a fuse to meet the needs of the exemplary EV application, the benefits of the invention are not necessarily limited to EV applications or to the particular type or ratings described. Rather the benefits of the invention are believed to more broadly accrue to many different power system applications generating other current profiles. The invention can also be practiced in part or in whole to construct different types of fuses having similar or different ratings than those discussed herein. The EV current profile shown in FIG. 1 and the fuse described below are therefore discussed for the sake of illustration rather than limitation.

Figure 2:
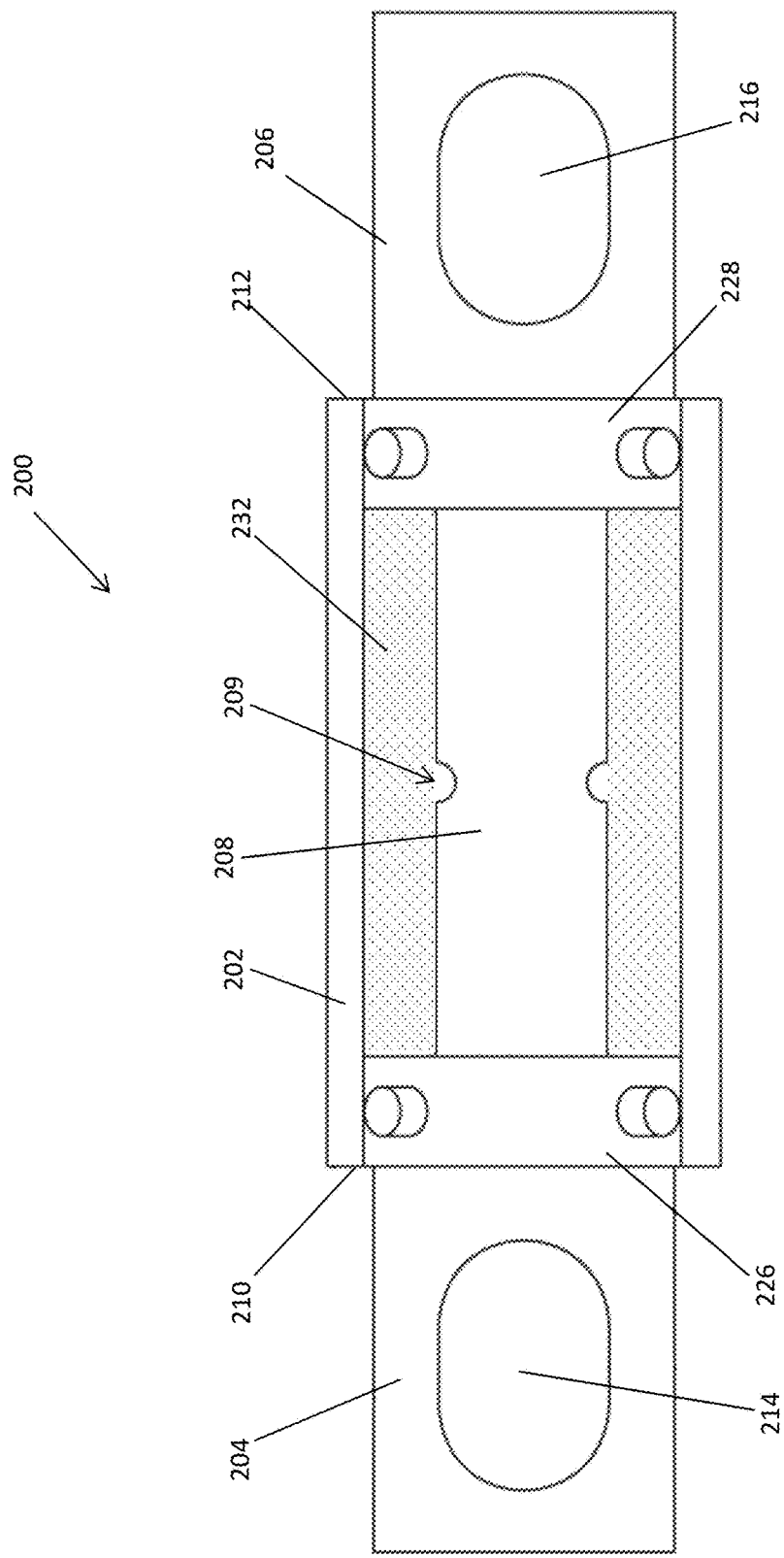
FIG. 2 is a top plan view of a high voltage power fuse that may experience the current profile shown in FIG. 1.

FIG. 2 is a top plan view of an exemplary high voltage power fuse 200 that may experience the current profile shown in FIG. 1 and that is designed for use with an EV power system. As shown in FIG. 2, the power fuse 200 of the invention includes a housing 202, terminal blades 204, 206 configured for connection to a line and a load side circuitry, and a fuse element 208 including a fuse element weak-spot 209 that completes an electrical connection between the terminal blades 204, 206. When subjected to predetermined current conditions, at least a portion of the fuse element 208 melts, disintegrates, or otherwise structurally fails and opens the circuit path between the terminal blades 204, 206. The load side circuitry is therefore electrically isolated from the line side circuitry to protect the load side circuit components and the circuit from damage when electrical fault conditions occur.

The fuse 200 in one example is engineered to provide a predetermined voltage rating and a current rating suitable for use in an electrical power system of an electric vehicle in a contemplated embodiment. In one example, the housing 202 is fabricated from a non-conductive material known in the art such as glass melamine in one exemplary embodiment. Other known materials suitable for the housing 202 could alternatively be used in other embodiments as desired. Additionally, the housing 202 shown is generally cylindrical or tubular and has a generally circular cross-section along an axis parallel to length of the terminal blades 204, 206 in the exemplary embodiment shown. The housing 202 may alternatively be formed in another shape if desired, however, including but not limited to a rectangular shape having four side walls arranged orthogonally to one another, and hence having a square or rectangular-shaped cross section. The housing 202 as shown includes a first end 210, a second end 212, and an internal bore or passageway between the opposing ends 210, 212 that receives and accommodates the fuse element 208.

In some embodiments the housing 202 may be fabricated from an electrically conductive material if desired, although this would require insulating gaskets and the like to electrically isolate the terminal blades 204, 206 from the housing 202.

Figure 3:
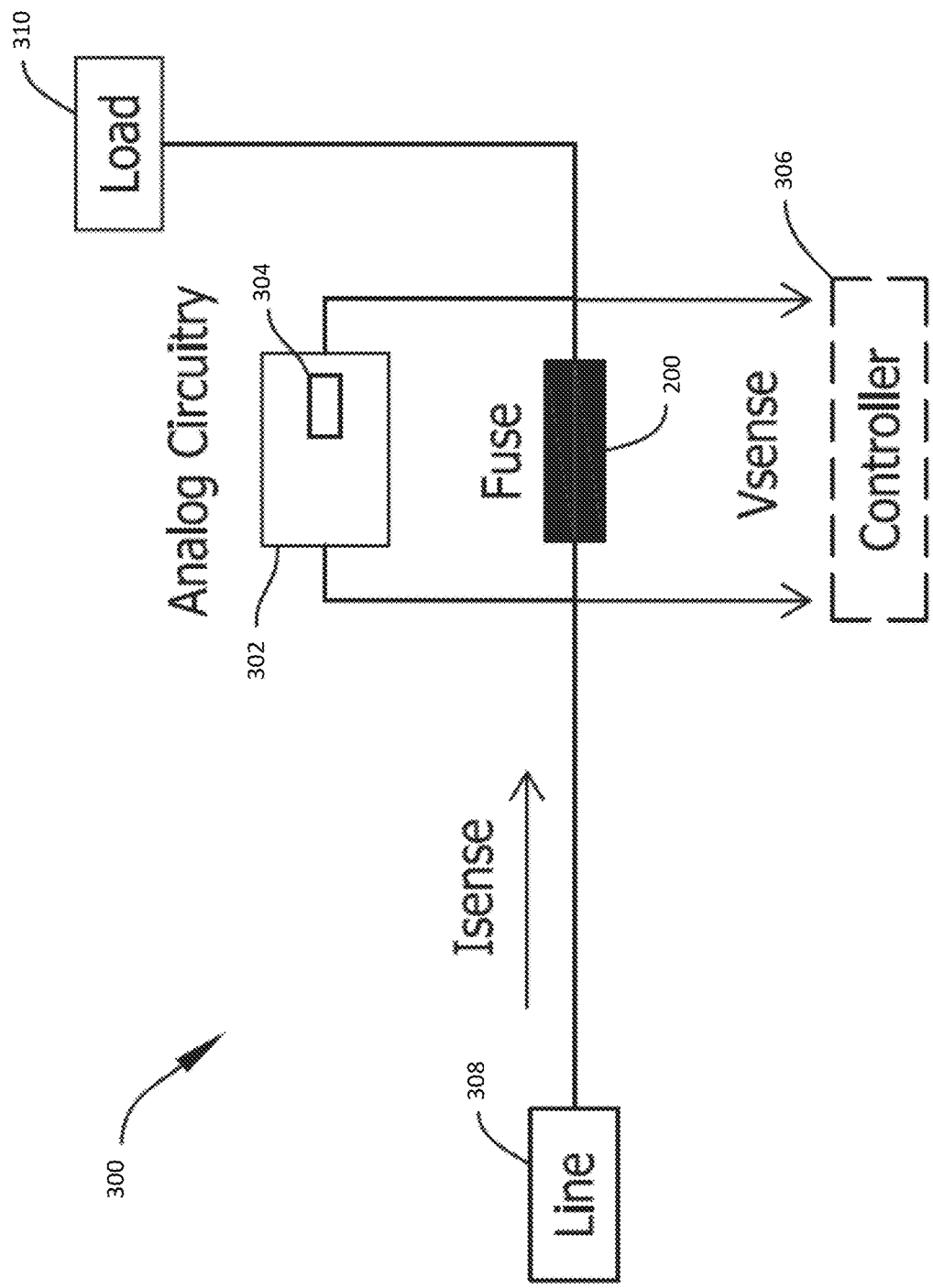
FIG. 3 is a partial circuit schematic of a portion of an electrical power system illustrating a first exemplary current sensing technique according to an embodiment of the present invention.

The terminal blades 204, 206 respectively extend in opposite directions from each opposing end 210, 212 of the housing 202 and are arranged to extend in a generally co-planar relationship with one another. Each of the terminal blades 204, 206 may be fabricated from an electrically conductive material such as copper or silver or suitable metal alloys in contemplated embodiments. Other known conductive materials may alternatively be used in other embodiments as desired to form the terminal blades 204, 206. Each of the terminal blades 204, 206 is formed with an aperture 214, 216 as shown in FIG. 3, and the apertures 214, 216 may receive a fastener such as a bolt (not shown) to secure the fuse 200 in place in an EV and establish line and load side circuit connections to circuit conductors via the terminal blades 204, 206.

While exemplary terminal blades 204, 206 are shown and described for the fuse 200, other terminal structures and arrangements may likewise be utilized in further and/or alternative embodiments. For example, the apertures 214, 216 may be considered optional in some embodiments and may be omitted. Knife blade contacts may be provided in lieu of the terminal blades as shown, as well as ferrule terminals or end caps as those in the art would appreciate to provide various different types of termination options. The terminal blades 204, 206 may also be arranged in a spaced apart and generally parallel orientation if desired and may project from the housing 202 at different locations than those shown.

In various embodiments, the end plates 226, 228 may be formed to include the terminal blades 204, 206 or the terminal blades 204, 206 may be separately provided and attached. The end plates 226, 228 may be considered optional in some embodiments and connection between the fuse element 208 and the terminal blades 204, 206 may be established in another manner.

An arc quenching medium or material 232 surrounds the fuse element 208. The arc quenching medium 232 may be introduced to the housing 202 via one or more fill openings in one of the end plates 226, 228 that are sealed with plugs (not shown). The plugs may be fabricated from steel, plastic or other materials in various embodiments. In other embodiments a fill hole or fill holes may be provided in other locations, including but not limited to the housing 202 to facilitate the introduction of the arc quenching medium 232.

In one contemplated embodiment, the arc quenching medium 232 includes quartz silica sand and a sodium silicate binder. The quartz sand has a relatively high heat conduction and absorption capacity in its loose compacted state, but can be silicated to provide improved performance. For example, by adding a liquid sodium silicate solution to the sand and then drying off the free water, silicate arc quenching medium 232 may be obtained with the following advantages.

The arc quenching medium 232 creates a thermal conduction bond of sodium silicate to the fuse element 208, the quartz sand, the fuse housing 202 and the end plates 226 and 228. This thermal bond allows for higher heat conduction from the fuse element 208 to its surroundings, circuit interfaces and conductors. The application of sodium silicate to the quartz sand aids with the conduction of heat energy out and away from the fuse element 208.

The sodium silicate mechanically binds the sand to the fuse element, terminal and housing tube increasing the thermal conduction between these materials. Conventionally, a filler material which may include sand only makes point contact with the conductive portions of the fuse element in a fuse, whereas the silicated sand of the arc quenching medium 232 is mechanically bonded to the fuse element. Much more efficient and effective thermal conduction is therefore made possible by the silicated arc quenching medium 232.

The fuse elements described in the fuse 200 utilize metal stamped or punched fuse elements, present some concern for EV applications including the type of cyclic current loads described above. Such stamped fuse element designs whether fabricated from copper or silver or copper alloys undesirably introduce thermal-mechanical strains and stresses on the fuse element weak-spots 209 such that a shortened service life tends to result than if the fuse 200 were used in another power system having a different current load. This shortened fuse service life manifests itself in the form of nuisance fuse operation resulting from the thermal-mechanical fatigue of the fuse element at the weak-spots 209.

In a contemplated system of the invention, the measurement of the fuse resistance may be made with precision by injecting a known current across the fuse element 208 as further described below. That is, the system may measure the non-linear fuse resistance while it is in service, and algorithms may be developed to assess the changes in resistance and estimate a temperature of the fuse element 208 based on the resistance of the fuse 200 and the ambient thermal conditions, as will be described further below.

FIG. 3 illustrates a first exemplary current sensing technique for an exemplary electrical power system 300 according to an embodiment of the present invention. The technique shown in FIG. 3 recognizes that the fuse 200, as are all electrical fuses, is essentially a calibrated resistor. Because a resistor drops a voltage during operation, knowing the voltage $V_{sense}$, the current $I_{sense}$ can be calculated using Ohms Law if fuse resistance $R_{fuse}$ is known. The voltage $V_{sense}$ across the fuse 200 does not allow a simple and direct determination of the current $I_{sense}$ using Ohm's law. This is because the fuse element 208 in the fuse 200 exhibits a non-linear resistance. That is, the resistance of the fuse element $R_{fuse}$ is subject to change in different operating conditions and as the resistance changes the detected voltage $V_{sense}$ will vary in a manner that does not always correlate with a change in current.

Compensation circuitry 302 is therefore provided to, among other things, iteratively detect at successive time periods the voltage $V_{sense}$, determine the resistance $R_{fuse}$ at each particular point in time, and calculate the current $I_{sense}$ using Ohm's law and/or predetermined relationships between voltage and resistance, temperature and current for the fuse element under certain operating conditions. Over time, changes in the fuse current $I_{sense}$ can be reliably determined from the detected fuse voltage $V_{sense}$ only, and effective current sensing may be realized without conventional current sensors such as those described above.

The compensation circuitry 302 may accordingly include a controller 304 that measures the fuse element voltage $V_{sense}$ at periodic intervals to account for variations in fuse resistance $R_{fuse}$, determines the fuse resistance $R_{fuse}$ at each periodic interval, and computes the current $I_{sense}$ based on the monitored voltage $V_{sense}$ and the determined resistance $R_{fuse}$. While the controller 304 is illustrated as part of the compensation circuitry 302, the controller may alternatively be provided elsewhere, including but not limited to in a sub-metering module (SMM) in, for example a combiner box including the fuse 200. That is, the controller 304 need not be a part of the compensation circuitry 302 itself in all embodiments, but instead may be separately provided.

The detected voltage $V_{sense}$ in some embodiments may optionally be input to another optional controller 306 at a local or remote location relative to the fuse 200 that calculates the current $I_{sense}$ in the manner described below. The controller 306 may be provided in addition to or in lieu of the controller 304. It is understood, however, that the functionality of the controllers 304, 306 shown may be combined into a single controller if desired. Regardless, one or both of the controllers 304, 306 may advantageously determine the resistance $R_{fuse}$ at any given point in time as explained below, and based on the determination of the resistance $R_{fuse}$ the current $I_{sense}$ can be computed using Ohm's law (i.e., $I_{sense}=V_{sense}/R_{fuse}$) while achieving a relatively smaller and more cost effective current sensing system than that shown in FIG. 1.

The controllers 304 and/or 306 may each be processor-based controllers. As used herein, the term "processor-based" shall refer not only to controllers including a processor or microprocessor, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

In lieu of or in addition to the controller 304, the compensation circuitry 302 may include a differential amplifier providing a direct or indirect voltage input to a processor-based device, or another voltage sensor or voltage sensor circuitry known in the art may be applied in the compensation circuitry 302 to detect the voltage Vsense for purposes of calculating the current Isense. The current calculation may be made in whole or in part within the compensation circuitry 302 or the compensation circuitry 302 may supply a voltage signal to another device to make the computation or complete the current computation.

In contemplated embodiments, algorithms are utilized by one or both of the controllers 304 or 306 to translate the non-linear response of the fuse element into calculated current readings. In the example, the fuse 200 is connected between line side circuitry 308 and load side circuitry 310. The calculated current readings are based upon an idealized performance of the fuse element at a steady state temperature equilibrium. Such idealized performance can be mathematically modeled using known relationships and/or experimentally established and verified for particular types and configurations of electrical fuses and fuse elements. The modeled performance can be expressed in graphical plots and/or mathematical relationships that can be utilized to calculate electrical current flowing through the fuse as changes in the voltage Vsense are detected.

Since different fuse elements have their own unique and individual variables and properties, a scheme for coding these unique variables and properties with the applicable modeled relationships is required for proper and accurate translation of the resistor voltage to a calculated current. A coding scheme may include RFID tagging and or bar code labeling.

Those in the art will appreciate that the electronic circuitry proposed requires an appropriate isolation scheme to isolate the system voltage of the electrical power system 300 from the electronics. Once determined, current data can be transmitted to a remote location, via, for example, optical or wireless communication systems, although other types of communication are possible if desired. Prognostic and/or diagnostic capability is provided that enhances oversight, monitoring and control of an electrical power distribution system, using a comparatively low cost and simple architecture of the current sensing system.

As described in detail below, contemplated embodiments simply and directly measure the voltage drop $V_{sense}$ across the fuse 200 at a predetermined frequency such as 20 Hz and, based on the measured voltage drop and prior characterization of the fuse via applied relationships of the fuse under idealized conditions, compute the current that causes the measured voltage drop. Advantageously, the current sensing architecture can be achieved at relatively low cost while providing sufficient accuracy for certain applications where only telemetry accuracy is required instead of high precision.

The current sensing techniques described thus far are premised on an idealized assumption that, while a fuse element typically exhibits a non-linear resistance when connected to energized electrical circuitry, a resistance of the fuse element is linearly dependent on temperature in certain operating conditions. With a focus toward these operating conditions, such linear dependence on temperature provides a basis to easily determine a resistance of the fuse element at those conditions, and in turn, calculate the current $I_{sense}$ at any desired point in time. In actuality, the idealized assumption behind the determination of fuse resistance and calculated current may or may not be realized, but nonetheless current can still be computed accurately in many instances as demonstrated further below.

Considering a well-known type of the fuse element 208 such as a conductive strip of metal (e.g., a copper strip) having one or more weak spots or areas of reduced cross sectional area, the idealized assumption of linear resistance and temperature at first glance may appear to be inappropriate. For example, copper has a temperature coefficient of 0.0038 and applying this coefficient one may expect a resistance of the fuse element to change by about 23% across a 60° C. temperature differential assuming that resistance actually does change linearly with temperature. However, in reality this assumption may amount to around 0.38% error per ° C. in conditions wherein the fuse element simply does not follow the assumed behavior.

The system 300 and methods described are easiest to implement and are more accurate in electrical power systems having relatively stable current load, but is more difficult in an EV power system having a random-type cyclic current pulse profile such as that shown in FIG. 1. Nonetheless, the system 300 and methods may be useful to provide estimations of the current flowing through the fuse 200 for use in calculating the temperature of the fuse element 208 in an EV power system as will be described below. Data collected by the system 300 may be beneficially used to refine algorithms to increase the accuracy of the resistance and temperature assessment made.

While the concepts described are illustrated in the context of calculating or otherwise deducing current in order to estimate at least the temperature of the fuse element 208 of the fuse 200, the concepts illustrated in FIG. 3 could alternatively be applied to other conductive elements besides a fuse. The use of circuit elements like fuses, circuit breaker contacts, electrical connections and all other components that introduce series resistance into the circuit in order to estimate a thermal condition of a component can be effectively applied with an accompanying compensation circuit operating. Since each circuit element used for current sensing can have its own unique and individual variables and properties, a scheme for coding these unique variables and properties with the circuit element is required for proper and accurate translation of the resistor voltage to a calculated current and finally to an estimated temperature of the component based on the calculated current and the ambient temperature for the purpose of estimating fatigue in the fuse element and a service life of the fuse, as described in detail below.

Once the current in the fuse element during operation of the EV or other electric system has been calculated or otherwise deduced, the temperature of the fuse element can be calculated, estimated, or otherwise deduced by one or both of the controllers 304 and 306 using trigonometric and algebraic operations with various computational systems, such as ANSYS®, for example.

In contemplated embodiments, algorithms can be utilized by one or both of the controllers 304 and 306 to translate the calculated or otherwise deduced current readings into calculated or otherwise deduced temperatures for the fuse element 208 during operational use. In a contemplated embodiments, one or both of the controllers 304 and 306 may deduce the calculated current readings, wherein at least one of the controllers 304 and 306 may at least one of calculate the current flowing through the fuse 200 and receive the calculated current readings from at least one other controller. In contemplated embodiments, one or both of the controllers 304 and 306 may receive current readings from any other component that facilitates deducing the temperature, and therefore the service life, of the fuse element 208 as described herein.

In one contemplated embodiment, to estimate the temperature of the fuse element 208 in real-time, a series of algorithms based on state-space modeling are utilized by at least one of the controllers 304 and 306. The series of algorithms can be used to estimate the fuse element 208 temperature based on a deduced current in the fuse element 208 and an ambient temperature of the environment in which the fuse 200 is located. Estimation of the temperature of the fuse element 208 includes deducing (i.e., calculating or receiving) the current in the fuse element 208 and the ambient temperature of the fuse 200, estimating a first temperature differential between the fuse element 208 and the arc quenching medium 232, estimating a second temperature differential between the arc quenching medium 232 and the ambient temperature, and finally, adding the first temperature differential, the second temperature differential, and the ambient temperature together to calculate the estimated temperature of the fuse element 208.

Figure 4:
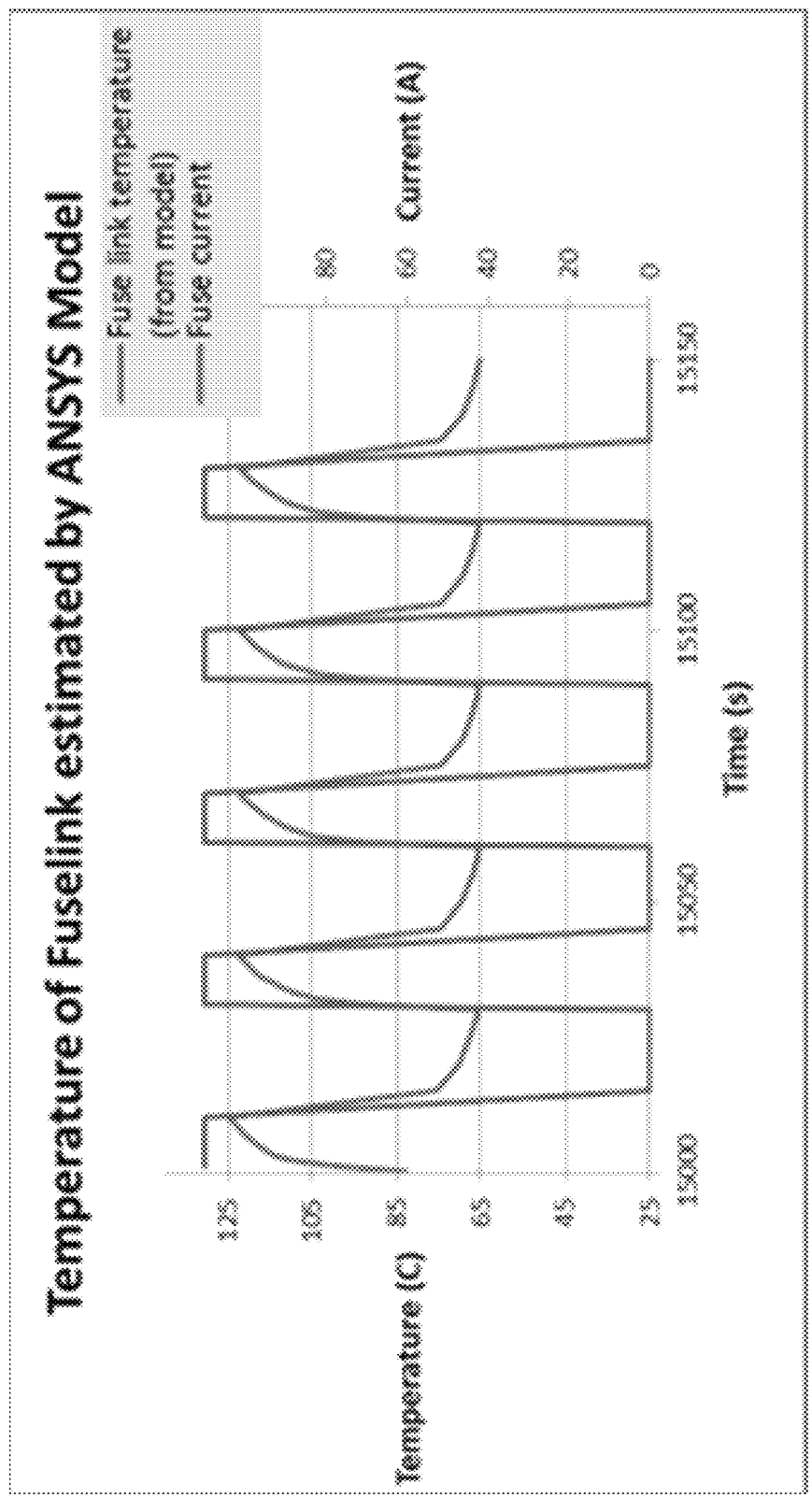

FIG. 4 illustrates an exemplary performance of the current deduction technique illustrated in FIG. 3 and an exemplary performance of an exemplary temperature calculation technique according to an embodiment of the present invention, wherein FIG. 4 illustrates a plot of deduced current versus time and a plot of calculated temperature versus time in the exemplary fuse element. Based on the deduced current in the fuse element 208, as illustrated in FIG. 4, the plot of the calculated temperature versus time is generated using at least one of the temperature deduction techniques described herein, such as calculating the temperature of the fuse element 208 using the ANSYS® system, for example.

The measured actual service lives of a first sample of fuses 200, including variables such as: an ambient temperature of the environment the fuse 200 is located in, a current pulse profile, a cold resistance of the fuse 200, a mean temperature of the fuse element 208 for the test period, and a temperature differential experienced by the fuse element 208 for the test period are illustrated below in Table 1. In this example, the ambient temperature measurements were obtained via a temperature sensor separate from the controllers 304 and 306, the current readings through the fuse elements 208 were deduced using the techniques described herein, and the fuse element 208 temperatures were calculated using the relationships and the ANSYS system described herein. In other contemplated embodiments, the ambient temperature can be measured by one or both of the controllers 304 and 306. In further contemplated embodiments, the current in the fuse element 208 can be sensed directly and the temperature of the fuse element 208 can be estimated using the techniques described herein.

where the analysis is performed on base ten logarithm of fuse 200 service life periods, $Log(N_{Estimated})$ is equal to the mean of the distribution of the logarithm of the fuse 200 service life periods for the sample, $Mean_T$ is the mean of the temperature experienced by the fuse element 208 during the observation period, $\Delta T$ is the temperature differential between a peak temperature and a minimum temperature

TABLE 1

| S.No | Ambient Temperature of test | Life(N) | ON Current of pulse profile (ON time = 10 s, OFF time = 20 s, OFF Current = 0A) | R_Cold | Mean_T | Del_T | Log10(R_Cold) | Log10(Mean_T) | Log10(Del_T) | Log10(N) |
|---|---|---|---|---|---|---|---|---|---|---|
| 1 | 29 | 127,000 | 100 | 1.5012 | 81 | 45 | 0.176438556 | 1.908766415 | 1.652391404 | 5.103803721 |
| 2 | 29 | 24,428 | 110 | 1.4983 | 94 | 57 | 0.17559878 | 1.973404974 | 1.756483964 | 4.387887911 |
| 3 | 29 | 24,428 | 110 | 1.5012 | 94 | 57 | 0.176438556 | 1.973404974 | 1.756483964 | 4.387887911 |
| 4 | 29 | 10,258 | 110 | 1.6011 | 94 | 57 | 0.204418458 | 1.973404974 | 1.756483964 | 4.011062695 |
| 5 | 29 | 7,935 | 110 | 1.6183 | 94 | 57 | 0.209059034 | 1.973404974 | 1.756483964 | 3.899546931 |
| 6 | 29 | 4,516 | 120 | 1.5199 | 110 | 71 | 0.18185015 | 2.039654006 | 1.854299968 | 3.654753933 |
| 7 | 29 | 7,380 | 120 | 1.5196 | 110 | 71 | 0.181729285 | 2.039654006 | 1.854299968 | 3.868065362 |
| 8 | 29 | 7,200 | 120 | 1.5269 | 110 | 71 | 0.183810595 | 2.039654006 | 1.854299968 | 3.857332496 |
| 9 | 29 | 5,453 | 120 | 1.5251 | 110 | 71 | 0.183298321 | 2.039654006 | 1.854299968 | 3.736635498 |
| 10 | 85 | 32,880 | 100 | 1.5083 | 124 | 50 | 0.178487731 | 2.0942038 | 1.702430536 | 4.516931809 |
| 11 | 85 | 31,141 | 100 | 1.5028 | 124 | 50 | 0.176901186 | 2.0942038 | 1.702430536 | 4.493332555 |
| 12 | 85 | 16,924 | 100 | 1.5113 | 124 | 50 | 0.179350682 | 2.0942038 | 1.702430536 | 4.228503017 |
| 13 | 85 | 7,899 | 105 | 1.5272 | 129 | 57 | 0.183895915 | 2.109747238 | 1.755112266 | 3.897572114 |
| 14 | 85 | 14,569 | 105 | 1.5082 | 129 | 57 | 0.178458936 | 2.109747238 | 1.755112266 | 4.163429743 |
| 15 | 85 | 14,569 | 105 | 1.5037 | 129 | 57 | 0.176987875 | 2.109747238 | 1.755112266 | 4.163429743 |
| 16 | 85 | 25,584 | 105 | 1.5111 | 129 | 57 | 0.179293206 | 2.109747238 | 1.755112266 | 4.407968446 |
| 17 | 85 | 1,082 | 120 | 1.5153 | 145 | 79 | 0.180498623 | 2.160588568 | 1.897187077 | 3.034227261 |
| 18 | 85 | 2,416 | 120 | 1.5021 | 145 | 79 | 0.176698846 | 2.160588568 | 1.897187077 | 3.38309693 |
| 19 | 85 | 120 | 120 | 1.6382 | 145 | 79 | 0.214366922 | 2.160588568 | 1.897187077 | 2.079181246 |
| 20 | 29 | 150,000 | 100 | 1.4943 | 81 | 45 | 0.174437796 | 1.908766415 | 1.652391404 | 5.176091259 |
| 21 | 85 | 12,268 | 110 | 1.505 | 134 | 64 | 0.1775365 | 2.125871467 | 1.805500858 | 4.088773767 |
| 22 | 85 | 13,944 | 110 | 1.5164 | 134 | 64 | 0.180813776 | 2.125871467 | 1.805500858 | 4.144387374 |
| 23 | 85 | 13,944 | 110 | 1.5207 | 134 | 64 | 0.182043546 | 2.125871467 | 1.805500858 | 4.144387374 |
| 24 | 85 | 10,924 | 110 | 1.4993 | 134 | 64 | 0.175888541 | 2.125871467 | 1.805500858 | 4.038381691 |
| 25 | 85 | 2,008 | 120 | 1.5189 | 145 | 79 | 0.181529182 | 2.160588568 | 1.898187077 | 3.302763708 |
| 26 | 85 | 3,409 | 120 | 1.5253 | 145 | 79 | 0.18335527 | 2.160588568 | 1.898187077 | 3.532627001 |
| 27 | 85 | 3,709 | 120 | 1.5121 | 145 | 79 | 0.179580513 | 2.160588568 | 1.898187077 | 3.569256833 |
| 28 | 85 | 3,989 | 120 | 1.4992 | 145 | 79 | 0.175859574 | 2.160588568 | 1.898187077 | 3.600864036 |
| 29 | 29 | 19,018 | 110 | 1.5162 | 94 | 57 | 0.180756492 | 1.973404974 | 1.756483964 | 4.279164843 |
| 30 | 29 | 17,577 | 110 | 1.5231 | 94 | 57 | 0.182728418 | 1.973404974 | 1.756483964 | 4.244944753 |
| 31 | 29 | 14,351 | 110 | 1.5284 | 94 | 57 | 0.184237029 | 1.973404974 | 1.756483964 | 4.156882164 |
| 32 | 29 | 20,195 | 110 | 1.5097 | 94 | 57 | 0.178890655 | 1.973404974 | 1.756483964 | 4.305243858 |
| 33 | 29 | 34,379 | 110 | 1.5143 | 94 | 57 | 0.180211922 | 1.973404974 | 1.756483964 | 4.53629324 |
| 34 | 29 | 29,821 | 110 | 1.5123 | 94 | 57 | 0.179637953 | 1.973404974 | 1.756483964 | 4.474522203 |

Figure 5:
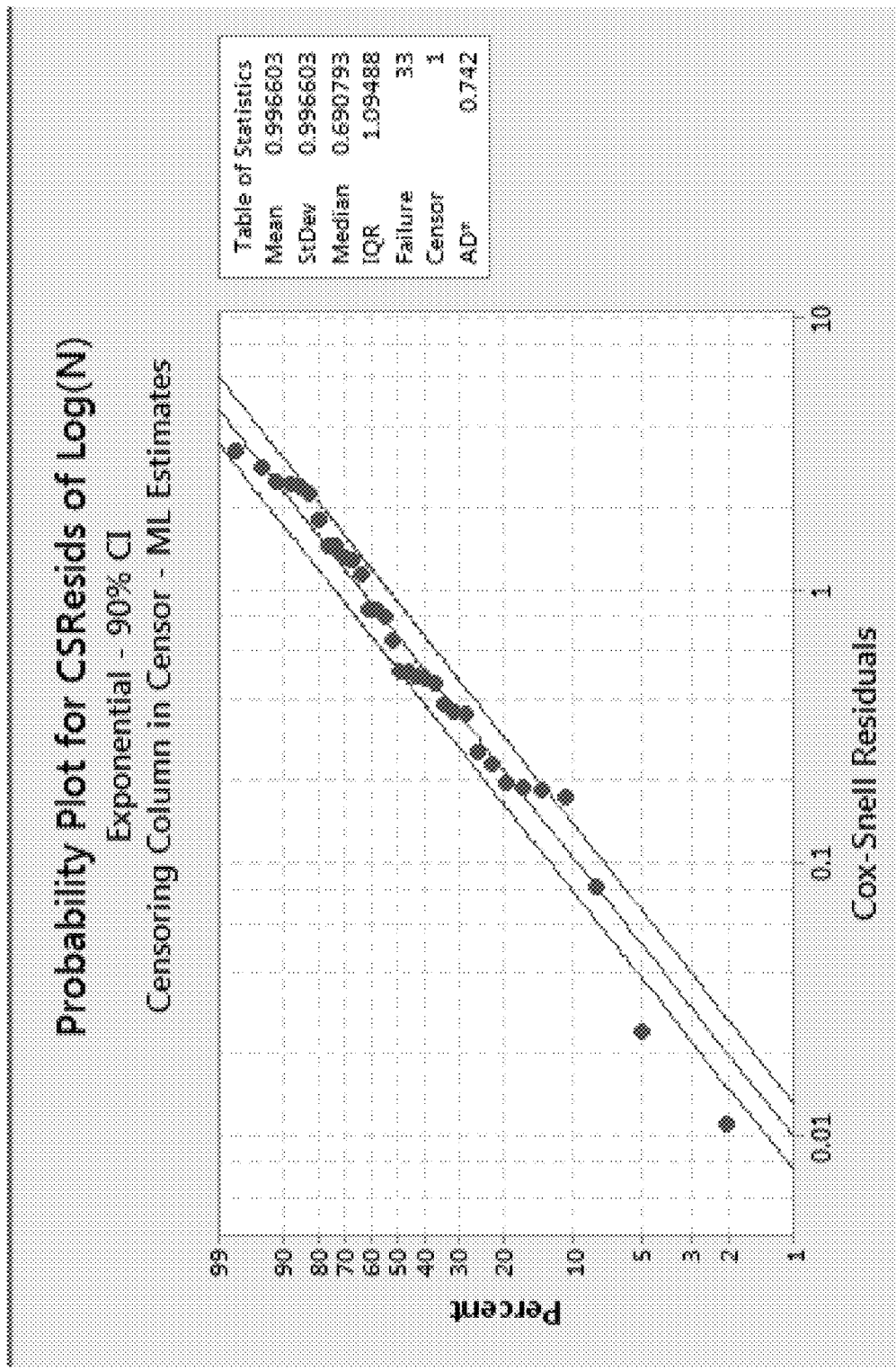
FIG. 5 illustrates a plot of actual measured fuse service lives for a first sample of fuses and a probability plot for Cox-Snell residuals having a ninety percent confidence interval based on the plot of the actual measured fuse service lives for the first sample of fuses.
Figure 6:
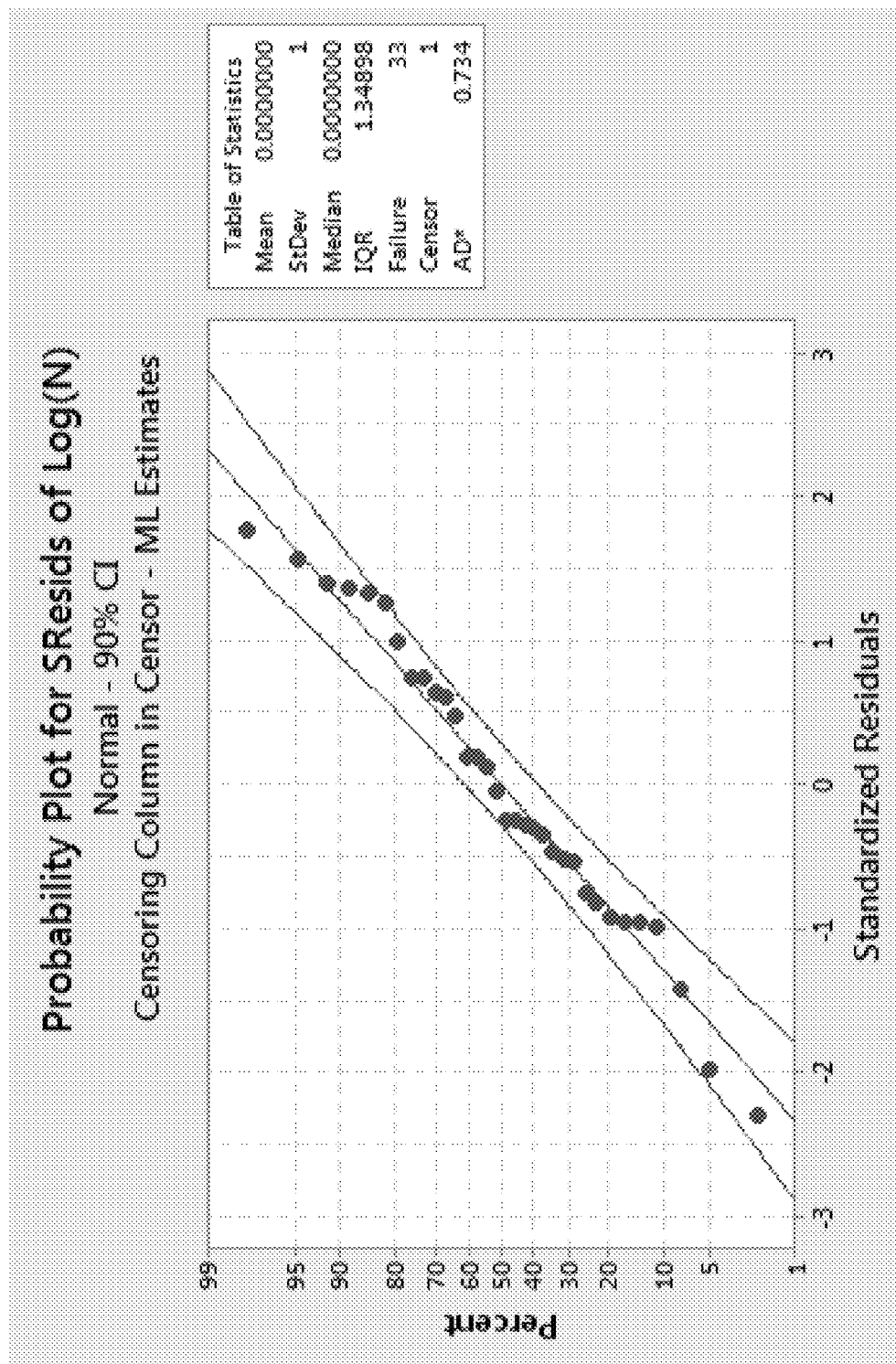
FIG. 6 illustrates a plot of the actual measured fuse service lives for the first sample and a probability plot for Cox-Snell residuals having a ninety percent confidence interval based on the plot of the actual measured fuse service lives for the first sample.

FIG. 5 illustrates a plot of the actual measured fuse 200 service lives illustrated in the above table and a generated probability plot for Cox-Snell residuals having a ninety percent confidence interval based on the plot of the actual measured fuse 200 service lives. FIG. 6 illustrates a second plot of the actual measured fuse 200 service lives illustrated in the above table and a generated probability plot for standardized residuals having a ninety percent confidence interval based on the plot of the actual measured fuse 200 service lives. The generated probability plots illustrated in FIGS. 5 and 6 can be utilized as described in further detail below to at least partially generate a regression model that can be used to estimate a service life of a given fuse 200 based on the temperatures experienced by the fuse 200 and the cold resistance of the fuse 200.

In a first contemplated fuse 200 service live estimation technique example, the B50 service life of the fuse 200 for a current and temperature profile as shown in FIG. 4 can be estimated as follows using a regression model deduced from the application of the fuse 200 service life data (illustrated in the table above):

$$Log(N_{Estimated}) = 21.5649 - 1.96608\ Log(Mean_T) - 4.8152\ Log(\Delta T) - 26.6347\ Log(R)$$

experienced by the fuse element 208 during the observation period, and R is the cold resistance of the fuse 200. In the contemplated example, a standard deviation of a normal distribution resulting from taking the logarithm of the fuse 200 service life periods is 0.17163. Using the standard deviation for the fuse 200 service life data, and applying it to the algorithm described above, the estimated B5 service life and the estimated B95 service life for the fuse 200 can be estimated following performance of the estimated B50 estimation techniques illustrated above.

Figure 7:
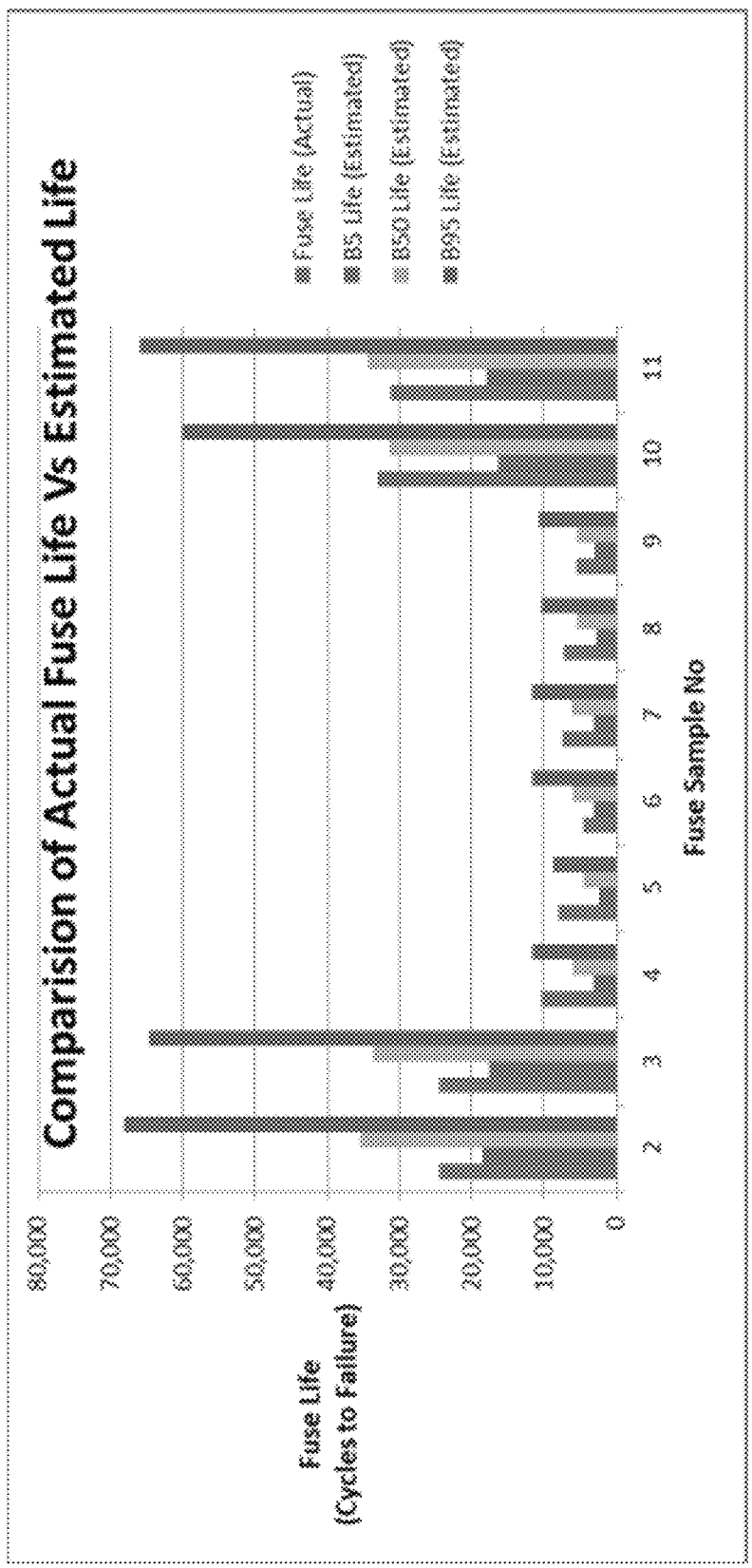
FIG. 7 illustrates a plot of actual measured fuse lives for a portion of the first sample of the fuses and an exemplary performance of an exemplary fuse service life estimation technique illustrating plots of an estimated B5 service life, an estimated B50 service life, and an estimated B95 service life for the portion of the first sample of the fuses.
Figure 8:
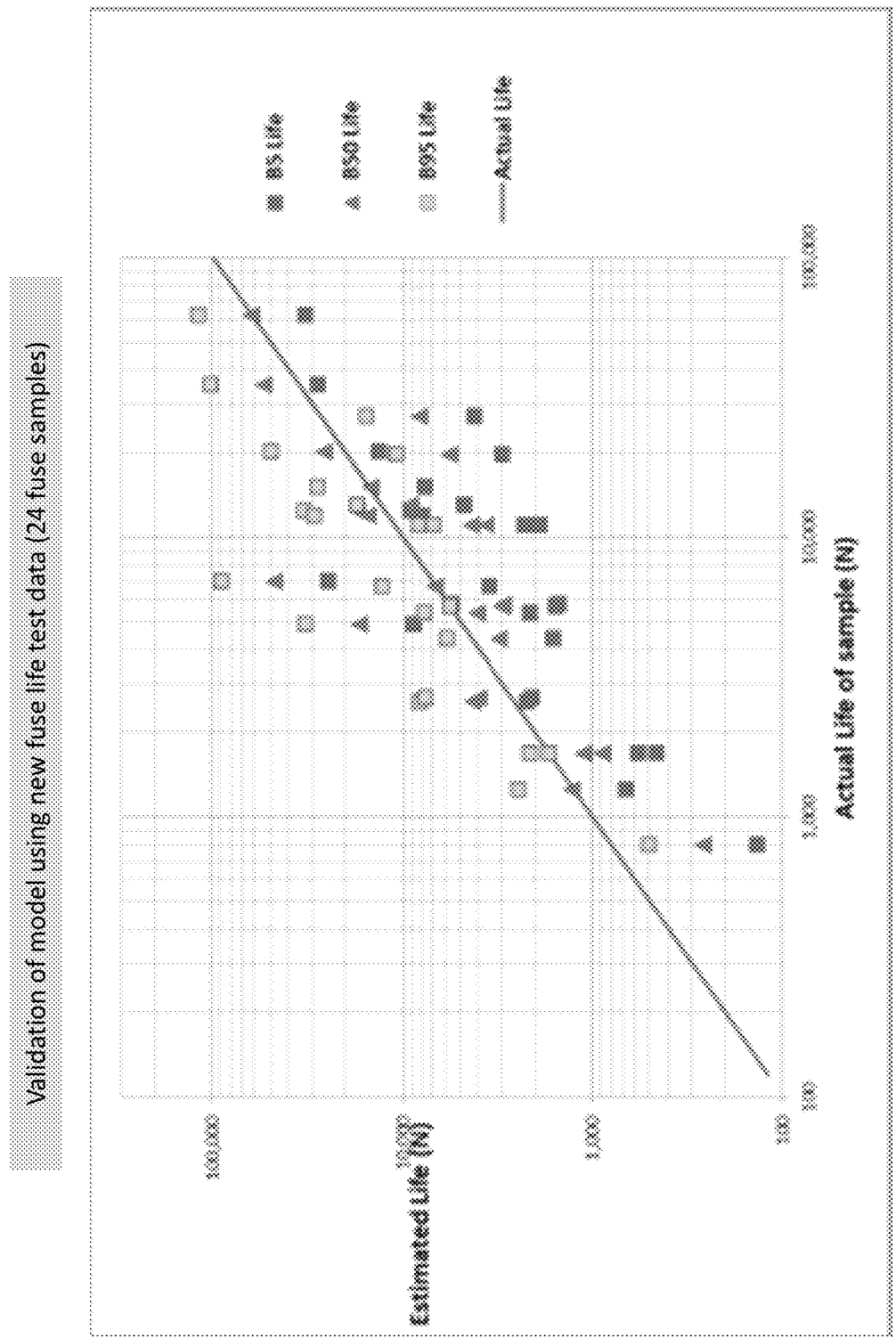

The performances of the regression model described above and based on the actual measured fuse 200 data illustrated in the table above, are shown in FIGS. 7 and 8. More specifically, FIG. 7 illustrates a plot of actual measured fuse 200 service lives for a subset of the fuses 200 sampled and illustrated in the above table and an exemplary performance of the exemplary fuse 200 service life estimation technique described above illustrating plots of an estimated B5 service life, an estimated B50 service life, and an estimated B95 service life for the subset of fuses 200. FIG. 8 illustrates an exemplary performance of the exemplary fuse 200 service life estimation, wherein FIG. 8 illustrates plots of an estimated B5 service life, an estimated B50 service life, and an estimated B95 service life for a second sample of the fuses 200 versus actual service life for the second sample of the fuses 200.

As can be seen in FIG. 7, the plots of the actual measured fuse 200 service lives for each of the sample fuses 200 fall between the estimated B5 service life and the estimated B95 service life estimated for each respective fuse 200 using the techniques and algorithms described herein. Specifically, the actual measured service lives for each of the fuse 200 samples are nearest in duration (number of cycles to failure) to the estimated B50 service lives on average, as would be expected for a normal distribution of service lives for the fuses 200. Additionally, as would be expected for a normal distribution of the fuse 200 samples, the estimated B95 service lives are approximately double the duration of the actual measured service lives for the fuses 200 of the sample.

As is illustrated in FIG. 8, estimated B5, B50, and B95 service lives for a second population of twenty four of the fuses 200 are estimated using the techniques and regression model described herein, and the service lives of the fuses 200 are plotted against the actual measured service lives for the second population of the fuses 200. With reference to the plotted estimated B5, B50, and B95 service lives illustrated on FIG. 8, each of the fuses 200 is represented by a discrete location along the "Actual Life of sample (N)" axis, with the estimated B5, B50, and B95 service lives for each sample lying along an axis aligned with the "Estimated Life (N)" axis. Specifically, a majority of the estimated B95 service lives for the fuses 200 of the second sample are greater in estimated duration than the actual service lives of the second sample of the fuses 200, a majority of the estimated B5 service lives for the fuses 200 of the second sample are lesser in estimated duration than the actual service lives of the second sample of the fuses 200, and a majority of the estimated B50 service lives for the fuses 200 of the second sample are approximately the same in duration as the actual service lives of the fuses 200 of the second sample.

The fuse service life estimation algorithms and techniques for fuse service life estimation described herein represent empirical-based relationships determined through application of scientific and mathematical processes. While the exemplary algorithms and relationships described herein facilitate efficient and effective estimation of a fuse service life, it is contemplated that other algorithms and relationships can be utilized to estimate the service life of a fuse through application of the techniques described herein.

Figure 9:
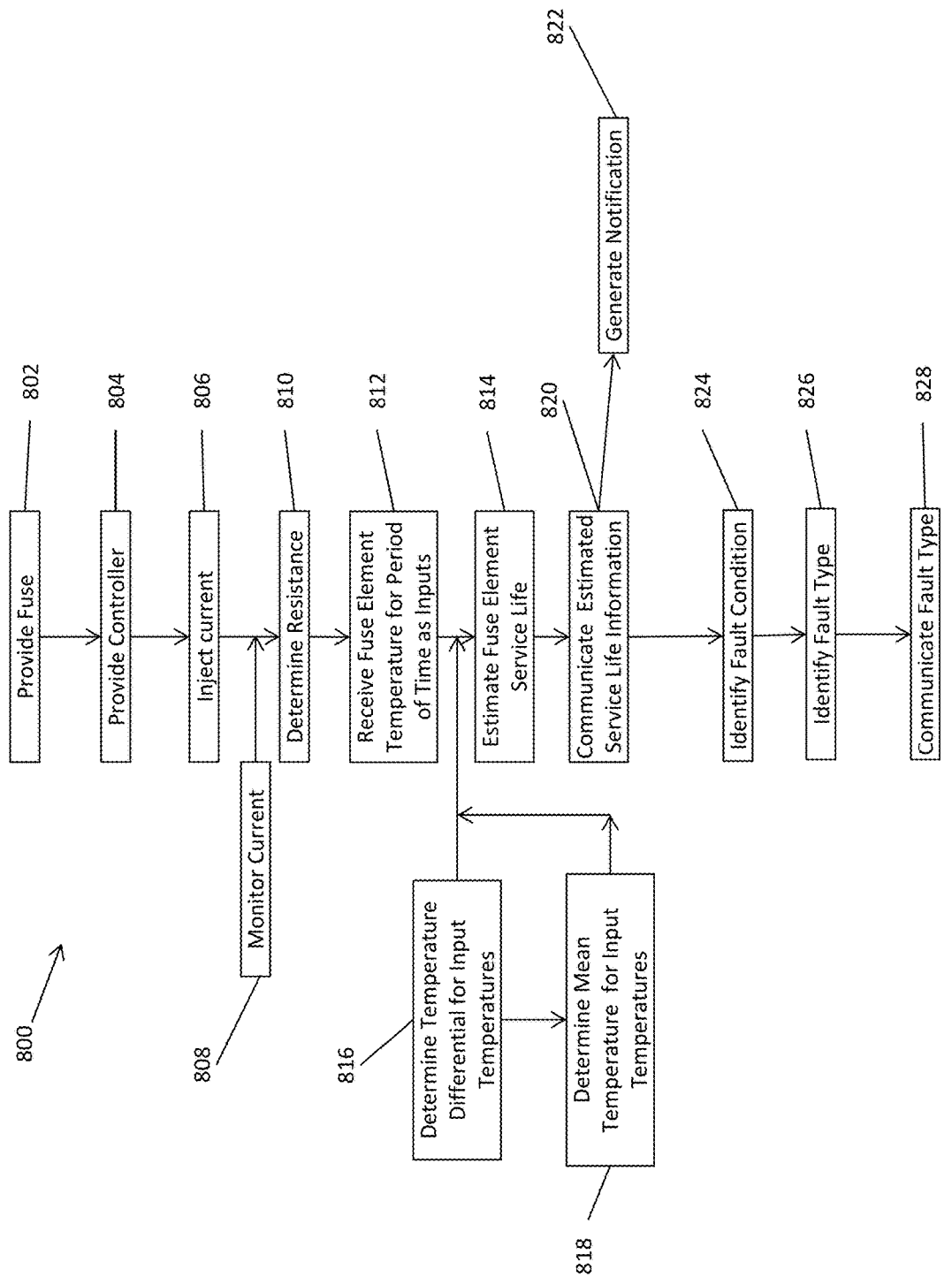
FIG. 9 is a method flowchart illustrating exemplary processes associated with the fuse temperature estimation techniques and systems shown in FIGS. 3-8.

FIG. 9 is a method flowchart illustrating exemplary processes 800 associated with the fuse resistance, current, and temperature deduction techniques and systems shown in FIGS. 3-8 that, in turn, allow for fuse service life estimation. The processes 800 may be performed electronically to implement an electrical fuse service life estimation system such as those described above or still further variations as appropriate or as described to flexibly meet particular needs of different electrical power systems. While the processes 800 may be particularly desirable in EV power system application as described above, they are not limited to EV power system applications and instead may be extended to any power system wherein determining a fuse temperature and the problems discussed above are of practical concern.

As shown in preparatory steps in FIG. 12, a fuse is provided at step 802 and a controller is provided at step 804. As described above, the fuse provided at step 802 may include one or more stamped metal fuse elements that define a geometry including at least one weak spot, and the controller provided at step 804 may include the controllers described above. In contemplated embodiments, the controller may be built-in to the fuse, and as such the steps 802 and 804 may be implemented in a single step, rather than in separate steps. In other contemplated embodiments, the controller may be built-in to a fuse holder or a disconnect switch including the controller. In still other embodiments, however, the controller provided at step 804 may be provided in another manner that facilitates evaluation. In embodiments including more than one controller as contemplated above, additional steps similar to the step 804 would be appropriately performed. When so provided, the controller or controllers supplied may monitor at least one thermal condition parameter over a period of time while the fuse provided at step 802 is connected to an energized electrical power system.

As represented at step 806 a current source may be provided and a current may be injected by the controller. Compensation circuitry such as that described above as that described above may be provided internal or external to the fuse and may be configured to detect current flow through the fuse. Using techniques such as those described above, the controller may be configured to deduce a current in the fuse element. In some cases, an optional separate current sensor (or current sensors) represented at step 808 may also be utilized to facilitate current measurements/deductions, determination of current type (constant or variable), and/or otherwise provide some ability to assess fuse element thermal conditions. As such current injection techniques and compensation circuitry are not necessarily required in all embodiments.

As shown at step 810, the controller is configured to determine the non-linear resistance of the fuse element in the fuse provided at step 802. In a contemplated embodiment, the determined resistance is utilized to calculate or otherwise deduce an amount of current flowing through the fuse element during operation of the EV at any given time.

As represented at step 812, fuse element temperatures for a period of time are received by the controller. Such fuse element temperatures may be one of sensed, calculated, estimated, or otherwise deduced, as described above. In some cases, the fuse element temperatures may be received by the controller from a separate controller.

In a contemplated embodiment, the calculated or otherwise deduced fuse element temperatures for a period of time and the cold resistance of the fuse are utilized to estimate a fuse service life as shown at step 814. Specifically, and as described above in detail, in some embodiments, based at least on the deduced fuse element temperatures for a period of time, a temperature differential for the input temperatures for the period of time is determined as represented by step 816. Additionally, as described above, based at least on the input temperatures of the fuse element for the period of time, a mean temperature for the input temperatures for the period of time is determined as represented by step 818. Finally, as shown at step 814, a regression model generated from experimental fuse service life observations is applied to at least the fuse element temperature differential for the period of time, the fuse element mean temperature for the period of time, and the cold resistance of the fuse to estimate the service life of the fuse. The estimation of the fuse service life may include estimation of the estimated B50 fuse service life, the estimated fuse B5 service life, and the estimated fuse B95 service life.

Once the fuse service life is estimated, the controller may communicate information regarding the estimated fuse service life as shown at step 820. The communication of the estimated fuse service life may be communicated in any manner such as those described above or known in the art. While wireless communication may be preferred in certain systems, wired communication may be preferred in others, and in some systems both wireless and wired communications could be utilized to provide redundant communication modalities. The estimated fuse service life communicated may, as described above, be communicated from one controller to another (or from one device to another) before being received at an appropriate destination wherein alerts or notifications can be generated as shown at step 822 to avoid nuisance-type operation of the fuse due to issues related to the thermal-mechanical fatigue experienced by the fuse element. In particular, communication of the information may include a reader device or a remote device in communication with the controller. In embodiments having multiple controllers, the controllers may determine or communication only a portion of the information to another controller or device that may further process the information received until eventually the estimated service life information is available for communication at step 820 for the ultimate purpose of notification at step 822 that the fuse has experienced a decrease in estimated service life and/or is nearing its estimated service life. Before such notification is appropriately generated, the estimated fuse service life information may be recorded and communicated as well to facilitate data archival and analysis functionality, as well as desired reports. This estimated fuse service life information can be used to assess the thermal-mechanical fatigue of the fuse element in view of the estimated thermal conditions experienced by the fuse element. These assessments can be made using an empirical model such as the regression model described above, applying Miner's rule of accumulated damage components of thermal cycles, or by other techniques familiar to those in the art.

After the notification of step 822 is generated, some lead time may be afforded so that an appropriate action may be taken in regards to the notification, which may include fuse replacement, inspection, and/or further data logging to ensure that the use and enjoyment of the power system is not interrupted. In applications such as in the EV power system applications discussed, system reliability and user satisfaction can be enhanced by avoiding an otherwise unpredictable nuisance-type operation of the fuse attributable to fuse fatigue at least partially resulting from thermal-mechanical fatigue of the fuse.

As shown at step 824, the controller may be configured to identify a fault condition based on the estimated fuse service life. At step 826, the controller may also be configured to identify a specific type of fault condition in the electrical power system using techniques such as those described above (e.g., fault identification based on an assessment window of a predetermined duration). At step 828, the controller may be configured to communicate the type of fault condition. Such communication of specific types of fault conditions may be valuable to troubleshoot or optimize electrical power systems over time, as well as to provide real time feedback concerning the performance of electrical fuses in an electrical power system.

Having described the relationships, algorithms and computations functionally per the description above, those in the art may accordingly implement the relationships, algorithms and computations via programming of the controllers or other processor-based devices. Such programming or implementation of the concepts described is believed to be within the purview of those in the art and will not be described further.

The advantages and benefits of the invention are now believed to have been amply demonstrated in the exemplary embodiments disclosed.

An embodiment of an electrical conductor service life estimation system has been disclosed including: an electrical conductor having a cold resistance and a non-linear resistance when connected to an energized electrical power system, and a controller operable to estimate a service life of the electrical conductor based on the cold resistance of the electrical conductor and input temperatures of the electrical conductor over time.

Optionally, the conductor may be a fuse element. The fuse element may be contained in a fuse housing, and the controller may also be contained in the fuse housing. Alternatively, the system may include a fuse holder, and the controller may be provided on the fuse holder. As still another alternative, the system may include a disconnect switch, and the controller may be provided on the disconnect switch.

The system may further include a reader device configured to communicate with the controller. The system may include a label associated with the conductor, and the reader device may be configured to read the label and utilize information from the label at least partially to estimate the service life of the conductor.

The controller may further be operable to estimate a service life of a fuse element based on a temperature differential of input temperatures of the fuse element for a period of time, a mean temperature of the input temperatures, and the cold resistance of the fuse. The controller may be configured to apply a regression model to the fuse cold resistance, the fuse element temperature differential of the input temperatures and the fuse element mean temperature of the input temperatures to estimate at least one of an estimated fuse B50 service life, an estimated fuse B5 service life, and an estimated fuse B95 service life.

An embodiment of an electrical conductor service life estimation system has also been disclosed including: an electrical fuse including a housing, first and second terminal elements, a fuse element having a cold resistance and a non-linear resistance when connected to an electrical power system, and a controller receiving as inputs fuse element temperatures for a period of time, wherein the controller is operable to estimate a service life of the electrical fuse in the energized electrical power system, and wherein the estimated service life of the electrical fuse is estimated based on a temperature differential of the input fuse element temperatures, a mean temperature of the input fuse element temperatures, and the cold resistance of the fuse element.

Optionally, the controller may be contained in the fuse housing. The system may include a fuse holder, and the controller may alternatively be provided on the fuse holder. The system may alternatively include a disconnect switch, and the controller may be provided on the disconnect switch. The electrical fuse may include at least one of a bar code and an RFID tag, and the system may include a reader device configured to communicate with the at least one of the bar code and the RFID tag to obtain information to facilitate making the fuse service life estimation. A label may be associated with the electrical fuse, and the reader device may be configured to read the label and utilize information from the label to determine the applicable cold resistance.

A method of estimating a service life of an electrical conductor in an electrical power system has been disclosed. The method includes: providing an electrical conductor having a cold resistance and a non-linear resistance when connected to an electrical power system; receiving as inputs temperatures of the electrical conductor for a period of time; and estimating a service life of the conductor based at least on at least the cold resistance of the conductor and the input temperatures of the conductor.

The method may optionally include providing the conductor having a cold resistance and a non-linear resistance when connected to an electrical power system comprises providing an electrical fuse including a fuse element. The fuse may include a fuse housing, and estimating the service life of the conductor may include estimating a service life of the fuse element inside the fuse housing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A thermal-mechanical fatigue assessment system comprising:
    an electrical conductor having a cold resistance and a non-linear resistance when connected to an energized electrical power system;
    an arc quenching medium; and
    a controller operable to estimate a service life of the electrical conductor based on the cold resistance of the electrical conductor and input fuse element temperatures of the electrical conductor over time, wherein the input fuse element temperatures include temperatures estimated for the electrical conductor based on current readings of the electrical conductor, ambient temperatures corresponding to the electrical conductor, a temperature differential between the electrical conductor and the arc quenching medium, and a temperature differential between the electrical conductor and the ambient temperature.

2. The thermal-mechanical fatigue assessment system of claim 1, wherein the electrical conductor is an electrical fuse including a housing, first and second terminal elements and a fuse element having the non-linear resistance when connected to an electrical power system.

3. The thermal-mechanical fatigue assessment system of claim 2, wherein the controller is further configured to estimate the service life of the electrical fuse based on a temperature differential of the input fuse element temperatures, a mean temperature of the input fuse element temperatures, and the cold resistance of the fuse element.

4. The thermal-mechanical fatigue assessment system of claim 3, wherein the controller is further configured to estimate the service life of the electrical fuse in the energized electrical power system over time using at least one regression model based on the temperature differential of the input fuse element temperatures the mean temperature of the input fuse element temperatures, and the cold resistance of the fuse element.

5. The thermal-mechanical fatigue assessment system of claim 3, wherein the controller is configured to wirelessly communicate at least one of the cold resistance of the electrical fuse, the temperature differential of the input fuse element temperatures, the mean temperature of the input fuse element temperatures, and the estimated service life of the electrical fuse.

6. The thermal-mechanical fatigue assessment system of claim 3, wherein the controller is configured to identify a type of fault in the electrical power system based on at least one of the temperature differential of the input fuse element temperatures, the mean temperature of the input fuse element temperatures over time, and the estimated service life of the electrical fuse.

7. The thermal-mechanical fatigue assessment system of claim 3, wherein the controller is further configured to estimate at least one of a B5 service life of the fuse element, a B50 service life of the fuse element, and a B95 service life of the fuse element, wherein the B5 service life represents a service life that the fuse element has a 95% probability of reaching, wherein the B50 service life represents a service life that the fuse element has a 50% probability of reaching, and wherein the B95 service life represents a service life that the fuse element has a 5% probability of reaching.

8. The thermal-mechanical fatigue assessment system of claim 3, wherein the service life of the electrical fuse is measured in at least one of thermal cycles of the fuse element, current cycles of the fuse element, and duration of energized use of the fuse element.

9. An electrical conductor service life estimation system for evaluating thermal-mechanical fatigue comprising:
    an electrical fuse including a housing, first and second terminal elements, and a fuse element having a cold resistance and a non-linear resistance when connected to an energized electrical power system;
    a controller receiving input fuse element temperatures and operable to estimate a service life of the electrical fuse in the energized electrical power system over time, wherein the input fuse element temperatures include temperatures estimated for the electrical fuse based on current readings of the electrical fuse, ambient temperatures corresponding to the electrical fuse, a temperature differential between the electrical conductor and an arc quenching medium, and a temperature differential between the electrical conductor and the ambient temperature; and
    wherein the estimated service life of the electrical fuse is estimated further based on a temperature differential of the input fuse element temperatures, a mean temperature of the input fuse element temperatures, and the cold resistance of the fuse element.

10. The electrical conductor service life estimation system of claim 9, wherein the controller is further configured to estimate the service life of the electrical fuse in the energized electrical power system over time using at least one regression model based on the temperature differential of the input fuse element temperatures, the mean temperature of the input fuse element temperatures, and the cold resistance of the fuse element.

11. The electrical conductor service life estimation system of claim 9, wherein the controller is configured to wirelessly communicate at least one of the cold resistance of the electrical fuse, the temperature differential of the input fuse element temperatures, the mean temperature of the input fuse element temperatures, and the estimated service life of the electrical fuse.

12. The electrical conductor service life estimation system of claim 9, wherein the controller is configured to identify a type of fault in the electrical power system based on at least one of the temperature differential of the input fuse element temperatures, the mean temperature of the input fuse element temperatures over time, and the estimated service life of the electrical fuse.

13. The electrical conductor service life estimation system of claim 9, wherein the controller is further configured to estimate at least one of a B5 service life of the fuse element, a B50 service life of the fuse element, and a B95 service life of the fuse element, wherein the B5 service life represents a service life that the fuse element has a 95% probability of reaching, wherein the B50 service life represents a service life that the fuse element has a 50% probability of reaching, and wherein the B95 service life represents a service life that the fuse element has a 5% probability of reaching.

14. The electrical conductor service life estimation system of claim 9, wherein the service life of the electrical fuse is based on at least one of thermal cycles of the fuse element, current cycles of the fuse element, and duration of energized use of the fuse element.

15. A method of estimating a service life of an electrical conductor in an energized electrical power system:
   measuring, by one or more sensors of a thermal-mechanical fatigue assessment system, sensor data associated with input fuse element temperatures for the electrical conductor having a cold resistance and a non-linear resistance when connected to the energized electrical power system, wherein the thermal-mechanical fatigue assessment system comprises the electrical conductor, an arc quenching medium, and a controller;
   receiving, by the controller of the thermal-mechanical fatigue assessment system, the input fuse element temperatures for the electrical conductor, wherein the input fuse element temperatures include temperatures estimated for the electrical conductor based on current readings of the electrical conductor, ambient temperatures corresponding to the electrical conductor, a temperature differential between the electrical conductor and the arc quenching medium, and a temperature differential between the electrical conductor and the ambient temperature;
   estimating, by the controller of the thermal-mechanical fatigue assessment system, the service life of the electrical conductor based on at least the cold resistance of the electrical conductor and the input fuse element temperatures; and
   sending, by the controller of the thermal-mechanical fatigue assessment system, instructions configured to generate a notification indicating the estimated service life of the electrical conductor.

16. The method of claim 15, wherein the electrical conductor is an electrical fuse including a housing, first and second terminal elements, and a fuse element.

17. The method of claim 16, wherein estimating the service life of the electrical conductor comprises estimating the service life of the fuse element based on a temperature differential of input fuse element temperatures, a mean temperature of the input fuse element temperatures, and the cold resistance of the fuse element.

18. The method of claim 17 further comprising estimating the service life of the fuse element in the energized electrical power system over time using at least one regression model based on the temperature differential of input fuse element temperatures, the mean temperature of the input fuse element temperatures, and the cold resistance of the fuse element.

* * * * *